United States Patent [19]

Kawagoe

[11] Patent Number: 4,514,894
[45] Date of Patent: May 7, 1985

[54] SEMICONDUCTOR INTEGRATED CIRCUIT DEVICE MANUFACTURING METHOD

[75] Inventor: Hiroto Kawagoe, Kodaira, Japan

[73] Assignee: Hitachi, Ltd., Tokyo, Japan

[21] Appl. No.: 567,519

[22] Filed: Jan. 3, 1984

Related U.S. Application Data

[60] Continuation of Ser. No. 327,119, Dec. 3, 1981, abandoned, which is a division of Ser. No. 141,574, Apr. 18, 1980, Pat. No. 4,365,263, which is a continuation of Ser. No. 634,772, Nov. 24, 1975, abandoned.

[30] Foreign Application Priority Data

Sep. 4, 1975 [JP] Japan .................................. 50-107350

[51] Int. Cl.³ .......................................... H01L 21/265
[52] U.S. Cl. ......................................... 29/571; 29/578; 29/591; 29/576 B; 148/187
[58] Field of Search ....................... 29/571, 576 B, 578, 29/591; 148/187; 156/657, 662, 653

[56] References Cited

U.S. PATENT DOCUMENTS

| | | | |
|---|---|---|---|
| 3,775,191 | 11/1973 | McQuhae | 29/571 X |
| 3,789,503 | 2/1974 | Nishida et al. | 29/571 |
| 3,865,650 | 2/1975 | Arita | 29/571 |
| 3,865,651 | 2/1975 | Arita | 29/571 |
| 3,873,372 | 3/1975 | Johnson | 148/1.5 |
| 3,874,937 | 4/1975 | Huber et al. | 148/1.5 |
| 3,914,855 | 10/1975 | Cheney et al. | 29/571 |
| 3,985,591 | 10/1976 | Arita | 29/571 |
| 4,011,653 | 3/1977 | Kato et al. | 29/571 |
| 4,183,093 | 1/1980 | Kawagoe | 357/41 |
| 4,235,010 | 11/1980 | Kawagoe | 29/577 C |

Primary Examiner—G. Ozaki
Attorney, Agent, or Firm—Antonelli, Terry & Wands

[57] ABSTRACT

In a semiconductor integrated circuit device composed of insulated gate field-effect transistors, the improvement comprises the fact that insulated gate field-effect transistors having gate insulating films of substantially equal thicknesses are arranged on a principal surface of a semiconductor substrate in the shape of a matrix. Gate input columns of the transistors are formed of polycrystalline silicon layers, and some of the transistors are enhancement type, while others are depletion type. Further, the respective transistors are formed by the self-alignment technique which employs the polycrystalline silicon layers as a diffusion mask, and the depletion type transistors are formed by implanting impurity ions opposite in the conductivity type to the substrate into selected areas of the surface of the substrate. Thus, a read only memory in a MOS-IC chip has its occupying area reduced remarkably.

14 Claims, 22 Drawing Figures

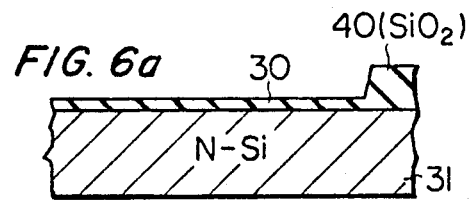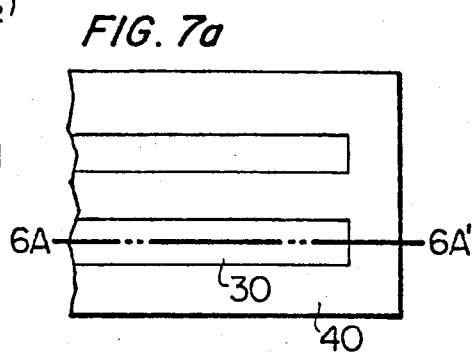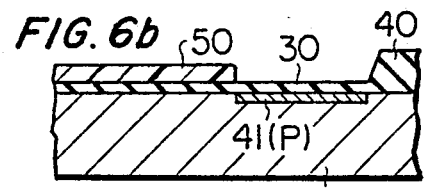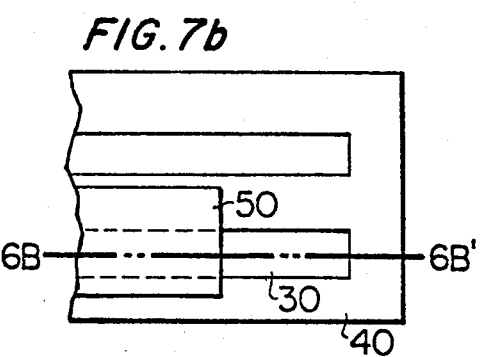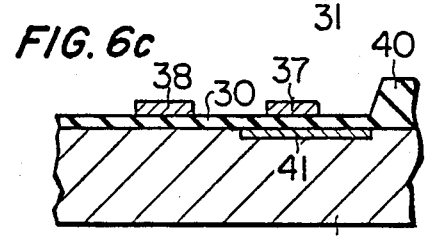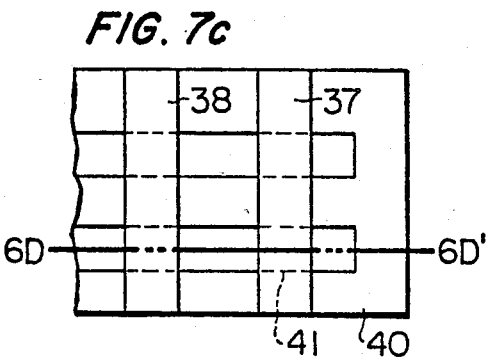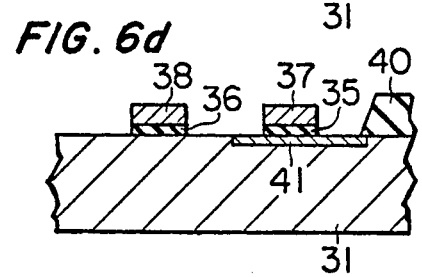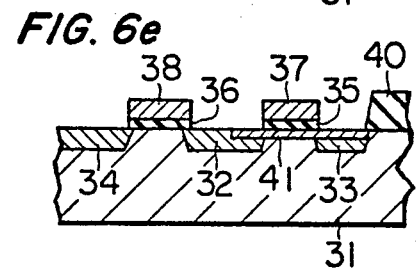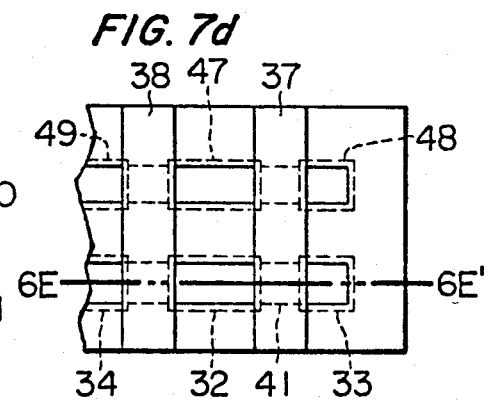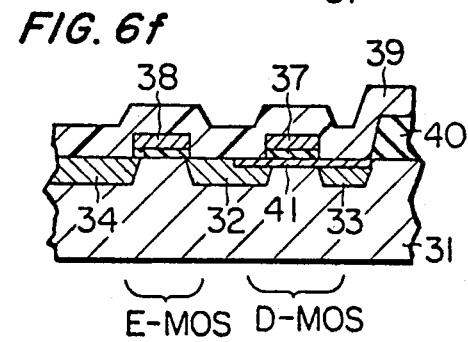

SEMICONDUCTOR INTEGRATED CIRCUIT DEVICE MANUFACTURING METHOD

This is a continuation of application Ser. No. 327,119, filed Dec. 3, 1981, now abandoned, which is a divisional application of application Ser. No. 141,574, filed Apr. 18, 1980, now U.S. Pat. No. 4,365,263, which is a continuation of application Ser. No. 634,772, filed Nov. 24, 1975, now abandoned.

BACKGROUND OF THE INVENTION

1. Field of the Invention

This invention relates to an integrated circuit device composed of insulated gate field-effect transistors (hereinbelow termed "MOSIC") and also to a method of manufacturing the same.

2. Description of the Prior Art

In general, a MOSIC uses aluminum or silicon as the material for the gate electrode. On the other hand, there are integrated circuits (IC) in which, in one internal circuit of an inverter stage, a load MOSFET of the enhancement type is employed as the load of a driving MOSFET operative in the enhancement mode (hereinafter called "E/E type IC") and there is an IC in which a load MOSFET of the depletion type is employed (hereinafter called "E/D type IC"). Among the ICs, the silicon gate MOSIC employing the depletion load has recently been extensively adopted as a device which is of higher performance for various uses and has a higher desnity of integration than the aluminum gate MOSIC. According to experiments by the inventor, the occupying area of an Si gate MOS transistor having self-aligned gate structure is reduced by approximately 20 to 30% as compared with that of an Al gate MOS transistor.

As a result of the investigation of MOSICs commercially available as produced by several manufacturers, however, it has been found that, in a read only memory (hereinbelow abbreviated to "ROM") which occupies a considerable part of a MOSIC chip, the size of the single bit of the ROM is not always remarkably smaller in the conventional Si gate ROM structure than in the Al gate ROM as indicated in the following Table:

TABLE

| IC manufacturer | Comparisons of ROM bit sizes | | type of IC |
| --- | --- | --- | --- |
| | Si gate ROM | Al gate ROM | |
| A | — μm² | 336 μm² | dynamic type |
| B | 616 | 650 | static type |
| C | 525 | — | static type |
| D | 412 | — | static type |
| E | 441 | 432 | static type |

SUMMARY OF THE INVENTION

It is, accordingly, a principal object of this invention to provide a novel ROM structure which has a conspicuously smaller occupying area than the prior art Al gate or Si gate ROMs, and a method of manufacturing such a novel ROM structure.

Another object of this invention is to provide an IC in which the occupying area of a ROM per unit function in the prior art MOSIC of the Si gate E/D type is conspicuously diminished, and a method of manufacturing such an IC.

BRIEF SUMMARY OF THE INVENTION

According to one aspect of this invention, there is provided a semiconductor integrated circuit device composed of insulated gate field-effect transistors characterized in that the insulated gate field-effect transistors having gate insulating films of substantially equal thicknesses are arranged on a principal surface of a semiconductor substrate in the shape of a matrix. Gate input columns of said transistors are formed of polycrystalline silicon layers, and some of the transistors are enhancement type, while others are depletion type.

BRIEF DESCRIPTION OF THE DRAWING

FIGS. 6a 6f and FIGS. 7a to 7d are enlarged sectional views and plan views respectively of a part of the MOSROM according to the invention for explaining a manufacturing process of the MOSROM;

FIG. 9b is a diagram showing an example of a circuit in the case of actually employing the MOSROM of the invention, while

DETAILED DESCRIPTION OF THE PRIOR ART

Figure 1:
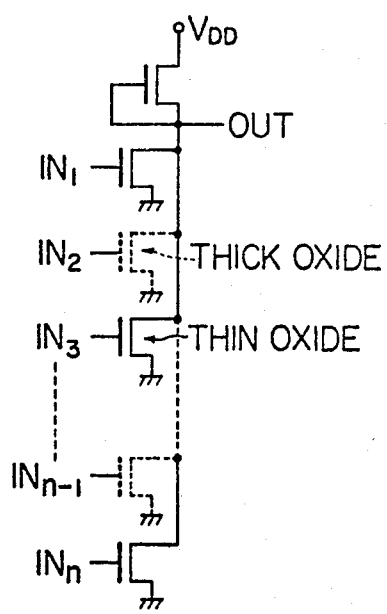
FIG. 1 is a fundamental circuit diagram of a prior art MOSROM.

Hereunder, the improved ROM (MOS matrix) according to the invention will be described in detail in comparison with a prior art Si gate ROM with reference to the drawing.

Figure 2A:
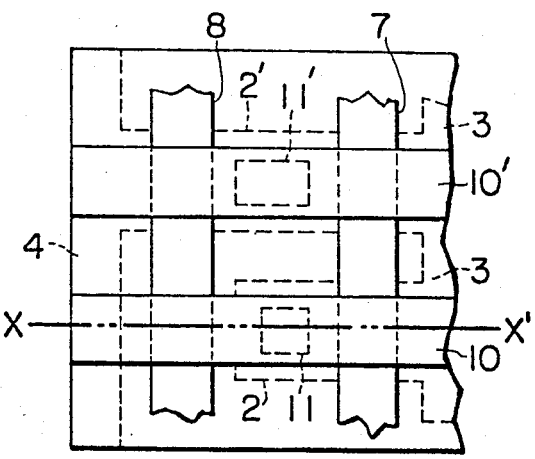
FIGS. 2a and 2b are enlarged plan and sectional views of a part of a prior art MOSROM, respectively.
Figure 2B:
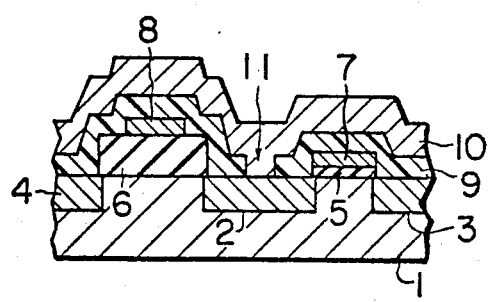

FIG. 1 shows a fundamental circuit which is used in the prior art Si gate ROM. FIG. 2a is a plan view showing a part of the prior art Si gate ROM on an enlarged scale, while FIG. 2b is a sectional view of the part of the prior art Si gate MOSROM taken along a line X—X' in FIG. 2a.

As is illustrated in FIG. 1, the prior art Si gate MOSROM consists of MOSFETs which are arranged in parallel. The states of the respective memory cells are segregated according to the thicknesses of their gate oxide films. A low level signal close to a supply voltage level is applied to a selected address line, whereas a high level signal close to 0 (zero) volts is applied to an unselected address line. Considering, by way of example, the case where a line IN₂ is selected, the MOSFET beneath this line has a thick gate oxide film and is usually "off", so that the output level becomes low. As is shown in FIGS. 2a and 2b, such a prior art ROM is constructed of P⁺-type diffused layers 2,3 and 4 in a substrate 1; polycrystalline silicon layers 7 and 8; silicon dioxide films 5 and 6; phosphosilicate glass 9; a through-hole 11; and an aluminum layer 10. In these FIGS. 2a and 2b, the "primed" reference numerals denote structure which corresponds to the "unprimed" reference numerals, e.g., 2′ denotes a P+-type diffused layer, 11′ denotes a through-hole and 10′ denotes an aluminum layer. The polycrystalline silicon layer is used as an address input line, while the aluminum layer is used as an output line. The through-holes between the Al layer and the P+-type diffused layers are necessary for commonly connecting the drain electrodes of the MOSFETs which are arranged at each row. As is apparent from the figures, the states of the memory cells at the points of intersection between the input lines and the output lines are determined by the thicknesses of the gate oxide films. More specifically, where a MOSFET which affects an "on-off" operation in response to signal voltages applied to the input line, required at a certain point of intersection, the gate oxide film beneath the polycrystalline Si layer at that place is made thin, while, where the MOSFET which conducts such operation is unnecessary thereat, the oxide film beneath the polycrystalline Si layer at that place is made thick. Thus, a ROM having a predetermined bit pattern is constructed. The minimum size per unit bit of the Si gate ROM of such a construction is about 410 $\mu m^2$, and it is substantially equal to that of the Al gate ROM.

As is described above, a conventional ROM is characterized by the following construction:

(1) The states of the respective memory cells are distinguished by the thicknesses of the gate oxide films.

(2) Since self-aligned gate structure is used, the polycrystalline Si layer cannot cross over the P+-type diffused layer. Therefore, an Al wiring layer is necessary, and a through-hole is required between the P+-type diffused layer and the AL layer.

Accordingly, the occupying area per bit of the prior art Si gate ROM cannot be made small, in spite of the adoption of self-aligned structure.

DETAILED DESCRIPTION OF THE INVENTION

The Si gate MOSROM according to this invention will now be explained with reference to FIGS. 3, 4a to 4c, and 5.

Figure 3:
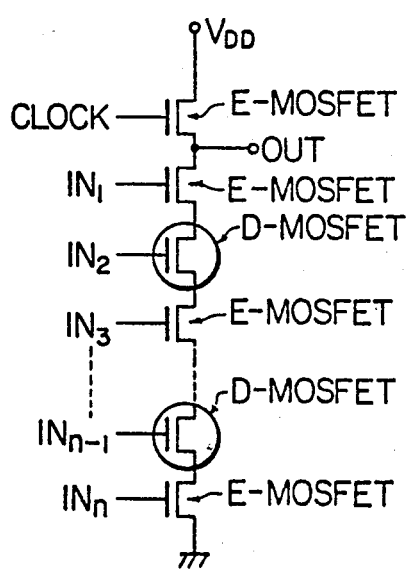
FIG. 3 is a fundamental circuit diagram of a MOSROM according to the invention.

FIG. 3 shows a fundamental circuit which is employed in the ROM according to this invention. It is composed of a plurality of enhancement mode and depletion mode MOSFETs which are connected in series as driving elements. A depletion mode MOSFET functions also as a resistance element. Read-out is stably executed in such a way that a high level signal close to 0 (zero) volts is impressed on a selected address line. At this time, a low level signal is impressed on an unselected address line.

By way of example, where the address line $IN_2$ is selected, the MOSFET beneath this address line $IN_2$ turns "on", since it is a depletion mode MOSFET. Since the MOSFETs associated with the address lines $IN_1$, $IN_3$, ... and $IN_n$ are enhancement mode MOSFETs, they turn "on" by having a low level signal applied to their gates. Since the MOSFET associated with the address line $IN_{n-1}$ is a depletion mode MOSFET, it is "on" even when a low level signal is applied to its gate. In this case, accordingly, all the driving elements are substantially "on", so that an output signal of a high level close to 0 (zero) volts is produced at an output terminal OUT.

On the other hand, where the address line $IN_3$ is selected, the MOSFET associated with this line becomes nonconductive (off) in response to an input signal of high level since it operates in the enhancement mode. Therefore, an output signal of low level appears at the output terminal OUT.

As is apparent from the above explanation, in the ROM according to this invention, the output data line to be precharged is maintained at a low level or is shifted to a high level in dependence on whether an enhancement or a depletion mode MOSFET is addressed, respectively.

Figure 5:
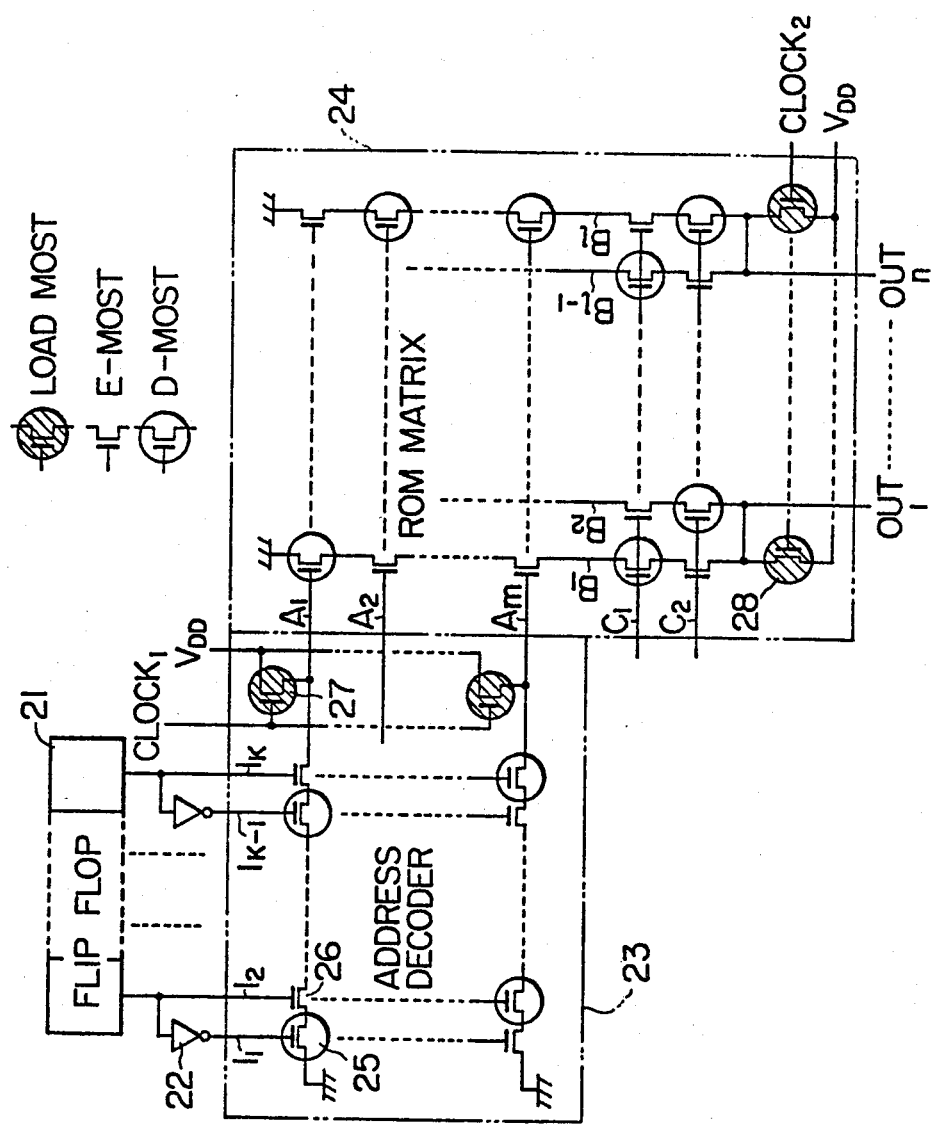
FIG. 5 is a diagram of an application circuit which adopts the MOSROM according to the invention.

FIG. 5 shows a ROM circuit which is constructed by applying this invention to an actual MOSIC ROM on the basis of the fundamental circuit of the invention illustrated in FIG. 3, and which comprises a first address decoder MOS matrix and a second MOS matrix receiving an output of the first MOS matrix as its input. A flip-flop circuit 21 consists of a plurality of stages (for example, k/2 stages) connected in cascade. Outputs from the respective stages are delivered directly or through inverter circuits 22 into the first MOS matrix 23, whose outputs are delivered into the second MOS matrix 24. The second MOS matrix provides outputs OUT 1 to OUT n. The matrices 23 and 24 have one MOSFET operative in the depletion or enhancement mode in any of the places in which input lines and output lines intersect. Such FETs are connected in series between a supply voltage $V_{DD}$ and a reference potential source (earth) at every column. Connected to the respective matrices as loads of the driving MOSFETs are enhancement mode MOSFETs (27,28) which have clock signals applied to the gates thereof. In the figure, the driving MOSFETs with circles as indicated at 25 are those operating in the depletion mode, while the other driving MOSFETs are those operating in the enhancement mode.

Each of the plurality of inverters 22 consists of a driving MOSFET which operates in the enhancement mode, and a load MOSFET which is connected in series therewith and which operates in the depletion mode. As will be described later, all the MOSFETs in the figure have gate insulating films (for example, $SiO_2$ films) of substantially equal thicknesses (about 500 to 1,500 angstrom) irrespective of whether they are depletion type or enhancement type. The depletion type MOSFETs in the MOS matrices are formed simultaneously with the depletion type MOSFETs in the inverters 22 by the same process. The input lines of the first and second matrices are formed of polycrystalline silicon wiring layers, while the connection from the output line of the first matrix to the input line of the second matrix is effected by the use of an aluminum wiring layer which connects a P+-type diffused layer and the polycrystalline Si layer. When FIG. 5 is studied with reference to FIG. 3, the operation of the circuit in FIG. 5 will be self-explanatory. To be particularly mentioned is that clock pulses $\phi_1$ and $\phi_2$ whose phases differ from each other are impressed on the gates of the load MOSFETs in the first and second matrices, respectively, and that the amplitudes of these pulses (for example, $-12$ to $-16$ volts) are greater than the amplitude of the supply voltage $V_{DD}$ (for example, $-6$ volts).

Figure 4A:
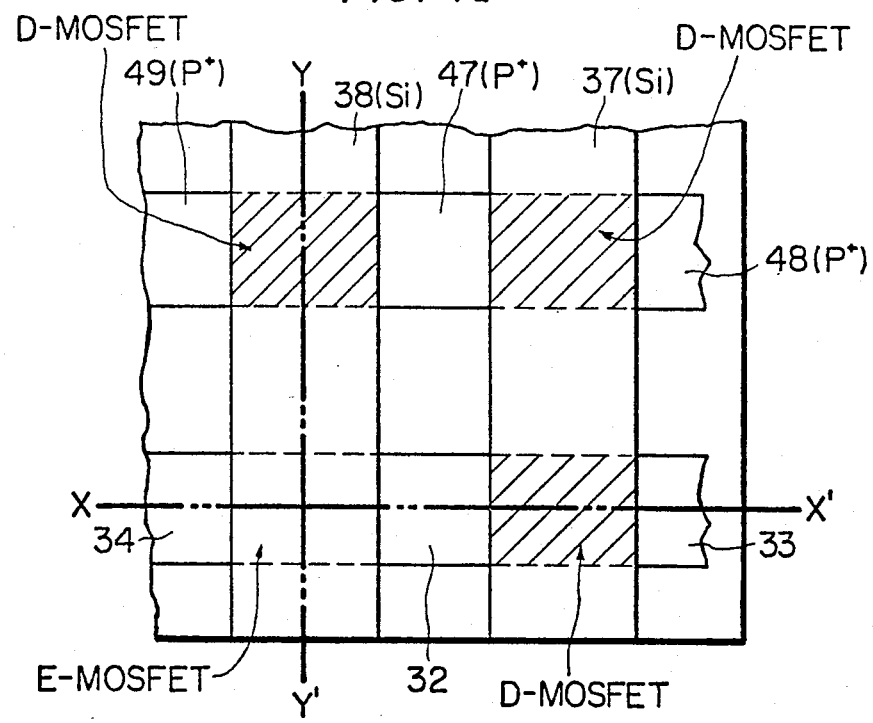
FIGS. 4a to 4c are enlarged plan and sectional views of a part of the MOSROM according to the invention, respectively.
Figure 4B:
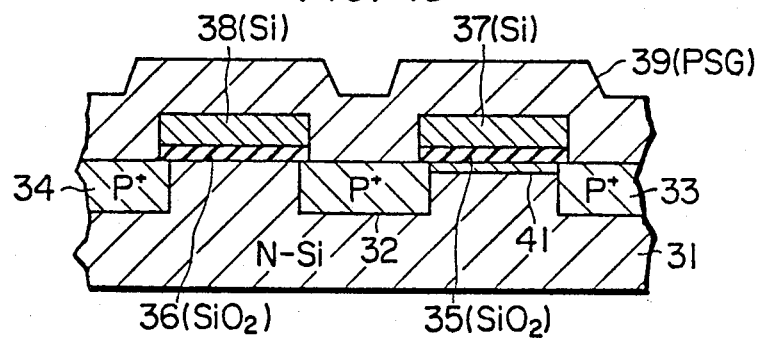
Figure 4C:
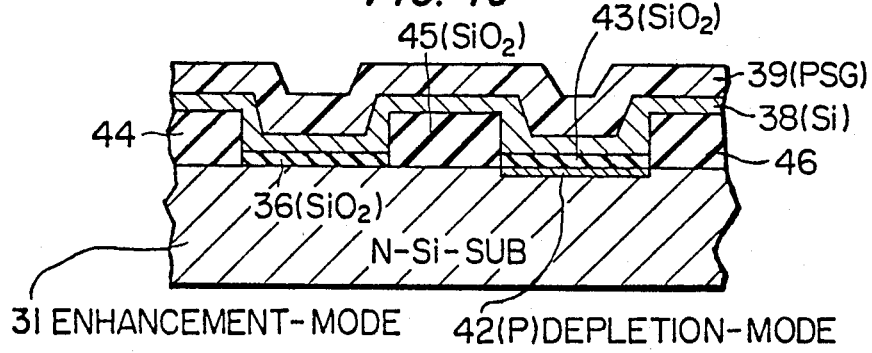

Referring now to FIGS. 4a to 4c, the device structure of the MOSROM according to this invention will be described. FIG. 4a is a plan view with a part of the MOSROM enlarged, while FIGS. 4b and 4c show X—X' and Y—Y' sections in FIG. 4a, respectively. In the figures, numeral 31 designates an N-type single crystal Si substrate; numerals 32 to 34 and numerals 47 to 49 are P+-type diffused layers which are formed by being self-aligned by Si gate electrodes; numerals 35, 36, and 43 are gate insulating films of silicon dioxide which have essentially equal thicknesses (about 1,000 Å); numerals 37 and 38 are input lines of polycrystalline Si; numeral 39 is an insulating film of phosphosilicate glass; numerals 41 and 42 represent P-type channel layers which are formed by implanting P-type impurity ions into selected areas of the surface of the substrate in order to form the depletion MOSFETs; and numerals 44 to 46 are field insulating films of silicon dioxide which are comparatively thick (about 1 to 2μ). As is apparent from the figures, one memory cell is formed in any of the places of intersection between the polycrystalline Si wiring layers (37,38) as the address input lines and the P+-type diffused layers as the self-connected data output lines. The states of the respective memory cells are determined by the presence or absence of the P-type channel formed by the ion implantation. All the memory cells have the thin gate oxide films so as to operate as an enhancement or depletion MOSFET.

As is seen from the figures, the MOS matrix according to this invention has self-aligned gate structure and needs no throughhole. It will therefore be understood that the occupying area for a single bit is remarkably smaller in the MOS matrix of this invention than in the prior art.

Figure 8A:
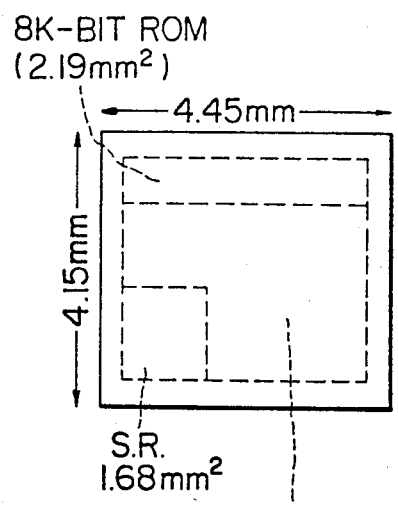
FIGS. 8a and 8b are top pattern diagrams of LSI chips of a MOSLSI adopting the invention and a MOSLSI fabricated by a prior art for making a comparison therebetween, respectively.
Figure 8B:
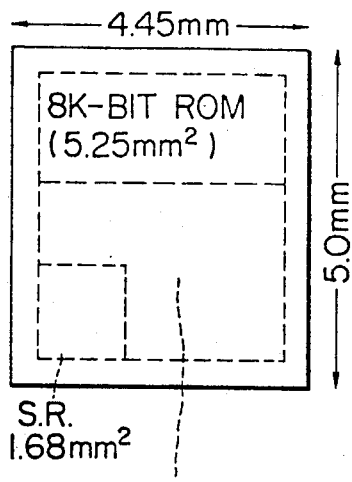

FIGS. 8a and 8b show, by comparison, the semiconductor chip sizes and the occupying areas of respective circuits in the cases where MOSICs for achieving the same circuit function are formed by the technique of this invention and by the Si gate MOS manufacturing technique of the prior art, respectively. By the adoption of the MOS matrix according to this invention, in comparison with the case of simply adopting self-aligned type Si gate MOSROM, the ROM part which occupies a comparatively large area in the LSI is reduced by approximately 50%. As a result, it becomes possible to decrease the overall chip size by approximately 20%.

Figure 9A:
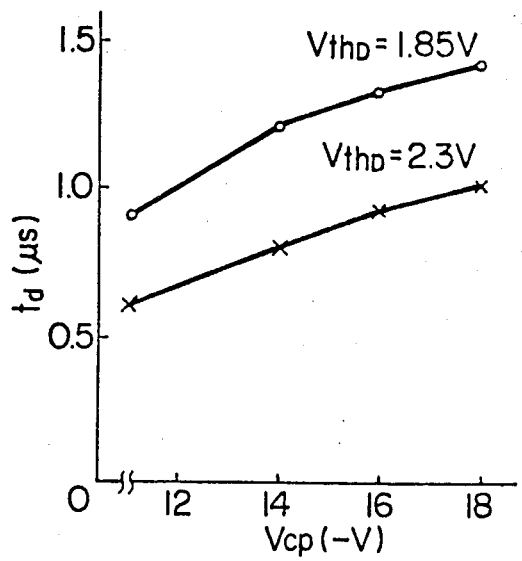
FIG. 9a is a graph showing the measured results of operating speeds in the circuit of FIG. 9b.
Figure 9B:
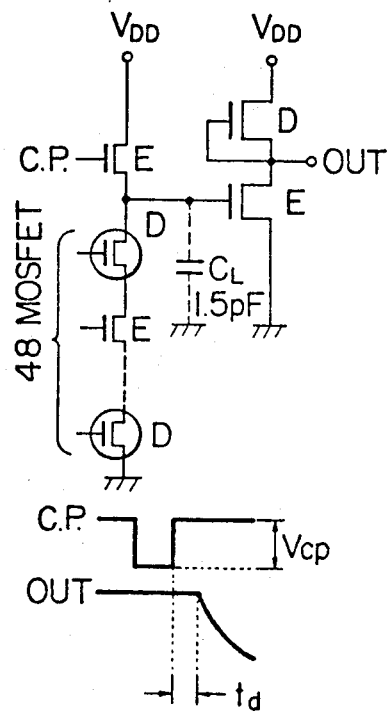

The operating speed of the ROM according to this invention will now be explained with reference to FIGS. 9a and 9b. Since a ratioless circuit as shown in FIG. 9b is employed, the output level of the ROM has two states, and as previously set forth, the precharged data line holds the low level or is shifted to the high level. In this case, the operating speed of the ROM is mainly dependent upon the discharge time $t_d$ in which the precharged data line is shifted to the high level. FIG. 9a illustrates the measurements of the relationship between the discharge time of the MOSROM shown in FIG. 9b (the ordinate $t_d$) and the amplitude of the clock pulse supplied to the gate of the load MOSFET of the enhancement mode (the abscissas $V_{cp}$), the MOSROM possessing 48 address lines and having 48 enhancement or depletion MOSFETs connected in series. Herein, the output capacitance of the ROM is approximately 1.5 pF. As is seen from the graph, the discharge time is smaller than 1.5 μs. Especially as an IC for an electronic desk top calculator, no problem is posed in practical use becaude operation on the order of 100 KHz is possible.

Description will now be made of a method of manufacturing the MOSROM according to this invention as shown in FIGS. 4a to 4c and FIGS. 5, reference being had to FIGS. 6a to 6f and FIGS. 7a to 7d. First, a SiO₂ film 40 about 1.4μ thick is formed in the surface of an N-type Si single crystal substrate 31, whose one principal surface is the (1 1 1)-face and which has a specific resistance of 5 to 8 Ωcm. Thereafter, those parts of the SiO₂ film on the principal surface of the substrate at which the MOSFETs are to be formed are removed in the shape of narrow slots. The exposed substrate surface is oxidized to form a thin SiO₂ film 30 (gate oxide film) of about 1,200 Å (refer to FIGS. 6a and 7a).

Subsequently, boron ions are implanted into the substrate surface through the thin SiO₂ film 30 at a concentration of about $1.4 \times 10^{11}$ atoms/cm². Further, a photoresist material layer 50 is deposited onto that part of the thin oxide film 30 on the substrate surface at which the depletion MOSFET is not to be formed. Using the photoresist layer and the thick oxide film as a mask, boron ions are again implanted into the substrate surface through the exposed thin SiO₂ film at a concentration of $6.5 \times 10^{11}$ atoms/cm². Thus, the P-type region 41 which constitutes the channel of the D-MOSFET is formed (refer to FIGS. 6b and 7b).

Subsequently, the photoresist layer is removed. Polycrystalline silicon is deposited on the entire oxide films to a thickness of about 5,000 Å. THose parts of the polycrystalline Si layer which are other than the parts for constructing the address lines (37, 38) are removed (refer to FIG. 6c). Subsequently, using the parts 37 and 38 of the polycrystalline Si layer remaining, the thin SiO₂ film 30 is removed, except for the gate oxide layers 35, 36, to expose the substrate surface (refer to FIGS. 6d and 7c).

Subsequently, by employing the polycrystalline Si layer 37, 38 and the thick SiO₂ film 40 as a mask, boron is diffused into the exposed substrate surface by the conventional vapor diffusion process. Thus, the P+-type diffused regions 32, 33, 34, 47, 48 and 49 having a thickness of about 0.8μ are formed (refer to FIGS. 6e and 7d.

Thereafter, phosphosilicate glass (PSG film) 39 having a thickness of about 0.9 to 1μ is deposited from vapor phase, to complete the MOSROM as shown in FIG. 6f. In this way, there is produced a MOS matrix of the present invention which comprises the combination of enhancement mode and depletion mode MOSFETs having the gate oxide films of substantially equal thicknesses. As is described above, in the MOS matrix of this invention, the respective input lines of polycrystalline Si and the respective P+-type diffused layers intersect substantially orthogonally, and all the insulating films beneath the polycrystalline Si layers at any place of the intersection have a thickness of about 1,200 Å, so that transistor operation is positively carried out.

Which transistors are made the depletion type is determined by the implantation of the boron ions as illustrated in FIG. 6b. Such a technique of fabricating the depletion MOSFETs is not specially shown but in case of forming the circuit as shown in FIG. 5 or FIG. 9b within the surface of a single semiconductor substrate, the aforecited MOSFETs are fabricated by the same process as that of the other depletion MOSFETs, for example, the depletion load MOSFETs of the inverters.

To sum up, the ROM according to the invention has the following features:

(1) The ROM of the invention is constituted of the enhancement type and depletion type MOSFETs as the driving elements.

(2) The size of the ROM of the invention is remarkably small, and it is reduced by about 50% as compared with that of the ROM of the prior art Si gate structure.

(3) The ROM of the invention is fabricated by a process which is compatible with the Si gate MOSLSI employing the depletion loads presently being extensively used.

(4) A cascade ratioless circuit is applicable to the ROM of this invention, and LSIs with extraordinarily excellent characteristics can be realized by paying sufficient attention to the estimation of the operating speed.

The general principle of the invention as described above can also be applied to other complicated logic circuits such as a programmable logic array and a four-phase ratioless dynamic circuit. It is accordingly to be understood that the scope of the present application is not restricted to the foregoing specific aspects of performance.

I claim:

1. A method of manufacturing a semiconductor integrated circuit device having a series gate matrix in which insulated field effect transistors are arranged in rows and columns and are serially connected in each row, comprising the steps of:
    (a) forming an insulating layer on the surface of a semiconductor substrate of a first conductivity type, said insulating layer having a plurality of substantially parallel slots forming relatively thin insulating portions, and relatively thick insulating portions between adjacent slots, said slots extending along a row direction;
    (b) selectively forming a masking layer on said thin and thick insulating portions to expose predetermined areas of said thin insulating portions;
    (c) introducing an impurity of a second conductivity type, opposite to said first conductivity type, into surface portions of said substrate beneath said thin insulating portions through said exposed areas by using said thick insulating portions and masking layer as a mask to form a plurality of first semiconductor regions of said second conductivity type being self-aligned with said slots;
    (d) selectively forming a plurality of gate electrode strips spaced from each other on the thin and thick portions of said insulating layer, along a column direction being substantially perpendicular to said slots, some of which said strips overlie said surface portions of said substrate; and
    (e) introducing an impurity of said second conductivity type into selected regions of the surface of said substrate between adjacent ones of said strips by using said strips in said slot of each row and parts of said thick insulating portions not covered with said strips as a mask to form a plurality of second semiconductor regions of said second conductivity type, being self-aligned with said strips and slots, adjacent ones of said second semiconductor regions in each row respectively serving as a source and a drain for an insulated field effect transistor having said strip located therebetween as a gate, each of said first semiconductor regions serving as a conductive path between adjacent second semiconductor regions which interpose each such first semiconductor region therebetween.

2. A method according to claim 1, wherein said gate electrode strips are made of polycrystalline silicon.

3. A method according to claim 2, wherein said substrate is a silicon substrate and said insulating layer is an SiO$_2$ layer.

4. A method according to claim 1, wherein said step (c) is carried out by implantation of the impurity of said second conductivity type.

5. A method according to claim 1, wherein said step (a) is carried out by forming a first, relatively thick insulating layer on the surface of the substrate, removing parts of said first insulating layer in the shape of and in the position of said slots and forming relatively thin insulating layers in said slots.

6. A method according to claim 1, wherein said impurity introduced in step (c) and the impurity introduced in step (3) are the same impurity.

7. A method according to claim 1, wherein said step (e) is carried out by removing said thin insulating portions on said selected regions of the surface of said substrate to form exposed selected regions and by diffusing said impurity into said exposed selected regions.

8. A method according to claim 1, wherein a phosphosilicate glass layer is formed over the surface of the substrate resulting after step (e).

9. A method according to claim 1, wherein each of said first semiconductor regions, between adjacent second semiconductor regions, constitutes a channel region for an insulated field effect transistor having the adjacent second semiconductor regions as source and drain regions therefor.

10. A method of manufacturing a semiconductor integrated circuit device having a series gate matrix in which insulated field effect transistors are arranged in rows and columns, and are serially connected in each row, comprising the steps of:
    (a) selectively forming a field oxide film having a plurality of parallel narrow slots along a row direction on the surface of a semiconductor substrate of a first conductivity type;
    (b) forming a plurality of gate oxide films in said parallel narrow slots and on the surface of said semiconductor substrate;
    (b) selectively forming a masking layer on said gate and field oxide films to expose predetermined areas of said gate oxide films;
    (d) introducing an impurity of a second conductivity type, opposite to said first conductivity type, into surface portions of said substrate beneath said gate oxide film through said exposed areas by using said field oxide film and masking layer as a mask to form a plurality of first semiconductor regions of said second conductivity type being self-aligned with said slots;
    (e) selectively forming a plurality of polycrystalline silicon strips spaced from each other along a column direction on said gate and field oxide films, some of which strips overlie said first semiconductor regions; and
    (f) introducing an impurity of said second conductivity type into surface portions surrounded with said field oxide film and strips by using said strips and parts of said field oxide film not covered with said strips as a mask to form a plurality of second semiconductor regions of said second conductivity type being self-aligned with said strips and slots, adjacent ones of said second semiconductor regions in each row, respectively, serving as a source and a drain for an insulated field effect transistor having said strip located therebetween as a gate, each of said first semiconductor regions serving as a conductive path between adjacent second semiconductor regions which interpose each such first semiconductor region therebetween.

11. A method according to claim 10, wherein said step (d) is carried out by implantation of the impurity of the second conductivity type.

12. A method according to claim 11, wherein said step (f) is carried out by removing said gate oxide films formed on said surface portions of said substrate to form exposed surface portions and by diffusing said impurity into said exposed surface portions.

13. A method according to claim 10, wherein each of said first semiconductor regions constitutes a channel region for an insulated field effect transistor having the adjacent second semiconductor regions as source and drain regions therefor.

14. A method according to claim 10, wherein a phosphosilicate glass is formed over the surface of the substrate resulting after the step (f).

* * * * *